United States Patent
Younis et al.

(10) Patent No.: US 7,184,511 B2
(45) Date of Patent: Feb. 27, 2007

(54) METHOD AND APPARATUS FOR DATA DENSITY-INDEPENDENT PHASE ADJUSTMENT IN A CLOCK AND DATA RECOVERY SYSTEM

(75) Inventors: Ahmed Younis, Austin, TX (US); Firas N. Abughazaleh, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 184 days.

(21) Appl. No.: 11/059,739

(22) Filed: Feb. 17, 2005

(65) Prior Publication Data

US 2005/0134339 A1    Jun. 23, 2005

Related U.S. Application Data

(63) Continuation-in-part of application No. 10/421,247, filed on Apr. 22, 2003, now Pat. No. 6,956,923, which is a continuation-in-part of application No. 10/346,435, filed on Jan. 17, 2003, now Pat. No. 6,977,959.

(51) Int. Cl.
*H03D 3/24* (2006.01)
*H03L 7/06* (2006.01)

(52) U.S. Cl. ...................... 375/374; 327/157
(58) Field of Classification Search ............... 375/371, 375/376, 355, 374, 354, 373, 316; 327/155–163
See application file for complete search history.

(56) References Cited

U.S. PATENT DOCUMENTS

| | | | |
|---|---|---|---|
| 5,329,559 | A | 7/1994 | Wong et al. |
| 5,483,558 | A | 1/1996 | Leon et al. |
| 6,034,554 | A | 3/2000 | Francis et al. |
| 6,225,831 | B1 | 5/2001 | Dalmia et al. |
| 6,356,160 | B1 | 3/2002 | Robinson et al. |
| 6,590,949 | B1 * | 7/2003 | Marten et al. ............. 375/376 |
| 6,732,349 | B1 | 5/2004 | Sun et al. |
| 6,771,728 | B1 | 8/2004 | Abernathy |
| 2002/0021470 | A1 | 2/2002 | Savoj |
| 2003/0001557 | A1 | 1/2003 | Pisipaty |

OTHER PUBLICATIONS

U.S. Appl. No. 10/346,435, filed Jan. 17, 2003, Brunn et al.
U.S. Appl. No. 10/421,247, filed Apr. 22, 2003, Younis et al.
U.S. Appl. No. 10/954,391, filed Sep. 29, 2004, Abughazaleh.
U.S. Appl. No. 11/040,423, filed Jan. 21, 2005, Davidson et al.

(Continued)

*Primary Examiner*—Tesfaldet Bocure
(74) *Attorney, Agent, or Firm*—James Harrison

(57) ABSTRACT

A data density independent clock and data recovery system includes a lock phase adjust charge pump operably coupled to receive phase information and transition information from a phase detector and to produce a current signal, responsive to the phase information and transition information, to a loop filter that converts the current signal to a control voltage signal operably coupled to a voltage controlled oscillator that produces a clock signal to the phase detector based on the control voltage signal. The lock phase adjust charge pump includes a phase charge pump, a transition charge pump, a programmable DC bias current sink, and two programmable offset bias current sinks. The transition charge pump includes a programmable transition current sink. The control logic operates under external control to adjust the currents conducted by the transition charge pump, the programmable DC bias current sink, and the two programmable offset bias current sinks.

20 Claims, 10 Drawing Sheets

OTHER PUBLICATIONS

Jafar Savoj, Behzad Razavi; "A 10-Gb / s CMOS Clock and Data Recovery Circuit with a Half-Rate Linear Phase Detector"; IEEE 2001; IEEE Journal of Solid-State Circuits, vol. 36, No. 5; May 2001; pp. 761-767.

Jafar Savoj, Behzad Razavi; "A 10-Gb / s CMOS Clock and Data Recovery Circuit"; IEEE 2000; 2000 Symposium on VLSI Circuits Digest of Technical Papers; pp. 136-139.

J.D.H. Alexander; "Clock Recovery from Random Binary Signals"; reprinted from Electronics Letters, J.D.H. Alexander, "Clock Recovery from Random Binary Signals"; vol. 11, pp. 541-542; Oct. 1975; Copyright Institution of Electrical Engineers; pp. 242-243.

Jafar Savoj, Behzad Razavi; "A 10-Gb / s CMOS Clock and Data Recovery Circuit with Frequency Detection"; ISSCC Feb. 5, 2001 /Session 5/Gigabit Optical Communications 1/53; pp. 433-435.

Jafar Savoj, Behzad Razavi; "Design of Half-Rate Clock and Data Recovery Circuits for Optical Communication Systems"; DAC 2001; Jun. 18-22, 2001; Copyright 2001 ACM; pp. 121-126.

Charles R. Hogge; "A Self Correcting Clock Recovery Circuit"; IEEE Journal of Lightwave Technology; vol. LT-3; Dec. 1985; pp. 249-251.

Jafar Savoj, Behzad Razavi; "A 10-Gb / s CMOS Clock and Data Recovery Circuit with a Half-Rate Linear Phase Detector"; IEEE Journal of Solid-State Circuits, vol. 38, No. 15; Jan. 2003; pp. 13-21.

Ankit Seedher et al.; "Fractional Rate Phase Detectors for Clock and Data Recovery"; 2003; IEEE; pp. 313-316.

* cited by examiner

MGT clock and data recovery circuit 20 lock phase adjust charge pump 36 lock phase charge pump timing diagrams method for lock phase adjust charge pump method for lock phase adjust charge pump phase locked loop circuit method phase locked loop circuit method MGT in columnar FPGA architecture

METHOD AND APPARATUS FOR DATA DENSITY-INDEPENDENT PHASE ADJUSTMENT IN A CLOCK AND DATA RECOVERY SYSTEM

CROSS REFERENCE TO RELATED APPLICATION

This application is a continuation-in-part of U.S. application Ser. No. 10/346,435, entitled "Clock and Data Recovery Phase-Locked Loop", by Brian Brunn, et al., filed Jan. 17, 2003, now U.S. Pat. No. 6,977,959 on Dec. 20, 2005 U.S. application Ser. No. 10/421,247, entitled "High Speed Phase Detector Architecture", by Ahmed Younis, et al., filed Apr. 22, 2003, now U.S. Pat. No. 6,956,923 on Oct. 18, 2005 and U.S. application Ser. No. 10/954,391, entitled "Clock and Data Recovery Circuit Having Operating Parameter Compensation Circuitry", by Firas N. Abughazaleh, filed Sep. 29, 2004 all of which are incorporated herein by reference in their entirety.

FIELD OF THE INVENTION

This invention relates generally to data communications and more particularly to clock and data recovery circuits used for such data communications.

BACKGROUND OF THE INVENTION

DESCRIPTION OF RELATED ART

Communication systems are known to transport large amounts of data between a plurality of end user devices, which, for example, include landline and cellular telephones, facsimile machines, computers, television sets, personal digital assistants, etc. As is also known, such communication systems may be local area networks (LANs) and/or wide area networks (WANs) that are stand-alone communication systems or interconnected to other LANs and/or WANs as part of a public switched telephone network (PSTN), a packet switched data network (PSDN), an integrated service digital network (ISDN), the Internet, etc. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is typically governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Another standard, which is for fiber optic data conveyances, is Synchronous Optical NETwork (SONET) that provides a data rate of 10 gigabits per second. In accordance with such standards, many system components and end user devices of a communication system transport data via serial transmission paths. Internally, however, the system components and end user devices process data in a parallel manner. As such, each receiving system component and end user device must receive the serial data and convert the serial data into parallel data without loss of information.

Accurate recovery of information from high-speed serial transmissions typically requires transceiver components to operate at clock rates that are comparable to the rate of the received serial data which, for today's high-speed systems, requires very high clock rates. Such high clock rates limit the usefulness of prior art clock and data recovery circuits since such clock and data recovery circuits are required to produce precise alignment of the local high-speed clock with received serial data to recover the data, which is difficult to achieve using today's integrated circuit (IC) fabrication techniques since the properties of the components of the clock and data recovery circuit vary over temperature, supply voltage, and/or IC fabrication process. To compensate for sampling point offset caused by the inherent component variation and to allow direct control over the positioning of the sampling clock edge, some prior-art designs include a fixed offset bias in the clock and data recovery circuitry. However, during periods of low data density the fixed offset bias causes the local high-speed clock to drift with respect to the received serial data. In addition, the high-speed serial data requires the clock and data recovery circuits to have a bandwidth wide enough to handle the high-speed serial data, which is also difficult to achieve using today's integrated circuit fabrication techniques.

Therefore, a need exists for a clock and data recovery circuit that operates at high speeds and may be implemented using today's IC fabrication techniques with less susceptibility to the above mentioned limitations.

BRIEF SUMMARY OF THE INVENTION

The clock and data recovery system of embodiments of the present invention substantially meets these needs and others by providing programmable complementary bias current levels according to whether transitions are present in a data stream to prevent a local high-speed clock from drifting with respect to the received serial data during the absence of transitions. An exemplary embodiment includes a clock and data recovery system having a Phase Detector (PD), a Phase-Frequency Detector (PFD), a lock phase adjust charge pump, a loop filter (LF), a Voltage Controlled Oscillator (VCO), a divider, and control logic. The phase detector is operably coupled to receive high data rate serial data and to recover even and odd data from the high data rate serial data based on a divided clock and to produce phase information and transition information based on the recovered data. The lock phase adjust charge pump is operably coupled to receive the phase and transition information from the phase detector and to produce a current signal, responsive to the phase and transition information, to the loop filter. The loop filter converts the current signal to a control voltage signal that is operably coupled to the voltage controlled oscillator that produces a clock signal to the phase detector based on the control voltage signal. The divider is operably coupled to receive the clock signal and to produce the divided clock to the phase detector based on an internally set divisor.

The lock phase adjust charge pump includes a phase charge pump, a transition charge pump with a programmable transition current sink and a programmable DC bias current sink. The phase charge pump is driven by the phase information while the transition charge pump is driven by the transition information. The control logic operates under external control to adjust the currents conducted by the transition charge pump, the programmable DC bias current sink, and two programmable offset bias current sinks.

The apparatus and methods of an embodiment of the present invention operably control the offset of the sampling point independent of the data density. This can be achieved by manipulating the programmable transition current sink and the programmable DC bias current sink in a complementary fashion.

The method of the embodiment of the present invention includes adjusting the current conducted by the programmable transition current sink by a first delta value and then adjusting the current conducted by a programmable DC bias current sink by a second delta value, wherein the second delta value is equal in magnitude but opposite in sign of the first delta value. The transition charge pump is driven by the transition information so that the current conducted by the programmable transition current sink and the current conducted by the programmable DC bias current sink substantially cancel when the transition information is in a first state and sum when the transition information is in a second state. As such, a net amount of current (and corresponding bias) that is introduced is a function of whether a transition has occurred in the inbound serial data to avoid the introduction of bias during periods of no data transitions to avoid a recovered clock drift and a related sample point drift. The current produced from the lock phase adjust charge pump is operably coupled to a loop filter that converts the current into a control voltage to adjust the frequency of a voltage controlled oscillator.

The above-referenced description of the summary of the invention captures some, but not all, of the various aspects of the present invention. The claims are directed to some of the various other embodiment of the subject matter towards which the present invention is directed. In addition, other aspects, advantages, and novel features of the invention will become apparent from the following detailed description of the invention when considered in conjunction with the accompanying drawings.

DETAILED DESCRIPTION OF THE INVENTION

Figure 1:
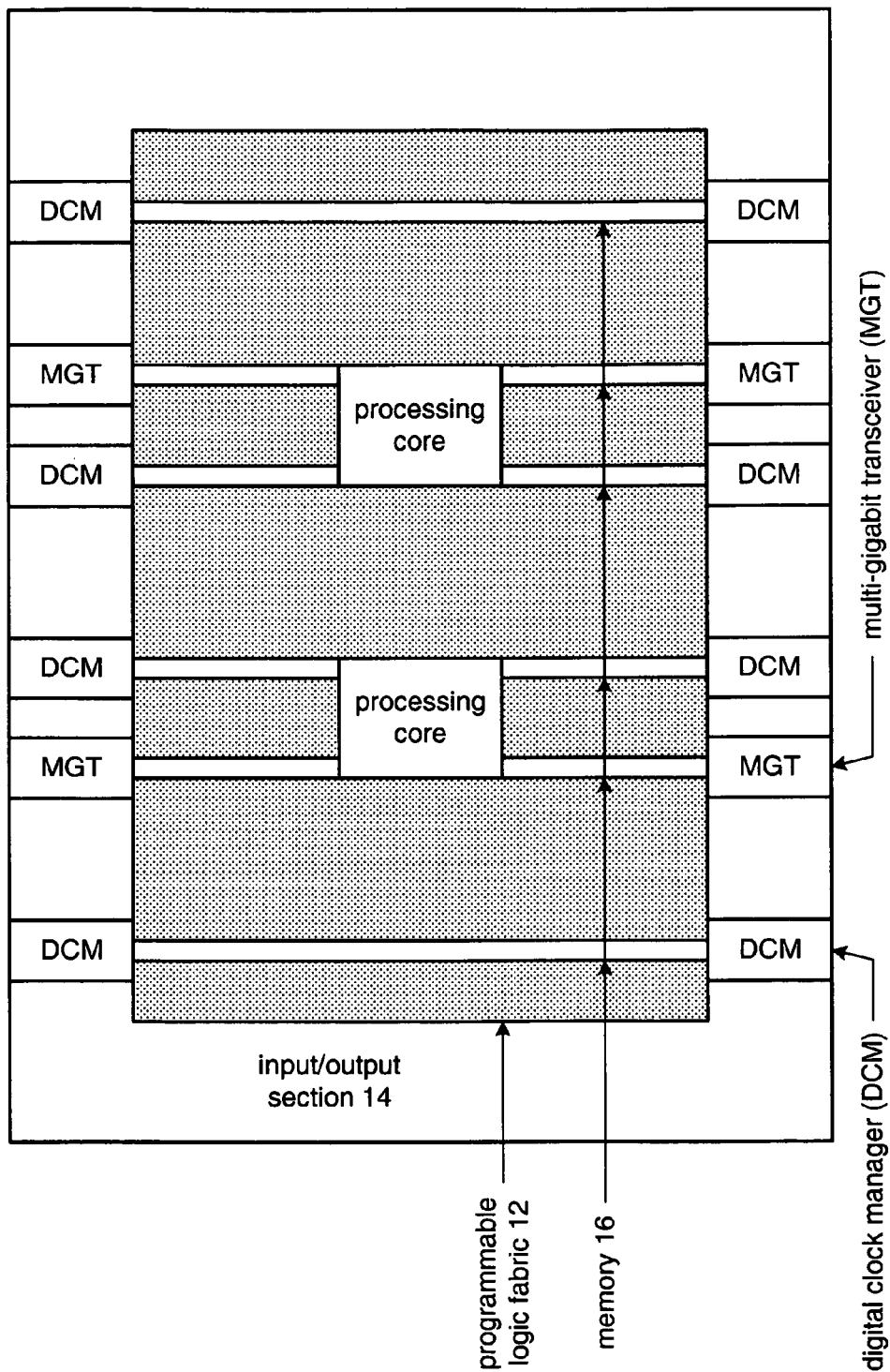
FIG. 1 is a schematic block diagram of a programmable logic device that includes programmable logic fabric, an input/output section, and memory.

FIG. 1 is a schematic block diagram of a programmable logic device 10 that includes programmable logic fabric 12, an input/output section 14, and memory 16. The programmable logic fabric 12 may include one or more processing cores and programmable logic circuitry. Such programmable logic circuitry may include programmable logic arrays (PLAs), programmable array logic (PAL) devices, erasable programmable logic devices (EPLDs) and/or programmable gate arrays (PGAs). Memory 16 may be block random access memory (BRAM). Input/output section 14 may include a plurality of digital clock managers (DCMs) and a plurality of multi-gigabit transceivers (MGTs).

The DCMs provide various clock signals to the programmable logic fabric 12 and may further provide clock signals to the multi-gigabit transceivers. The multi-gigabit transceivers provide digital interfaces for the programmable logic fabric 12 to exchange data with components external to the programmable logic device 10. In general, the multi-gigabit transceivers provide serial-to-parallel conversion of received serial data and provide parallel-to-serial conversion for outgoing data. Further, the digital clock managers may provide clock signals to memory, or other input/output modules, for double data rate and quad data rate accesses.

Figure 2:
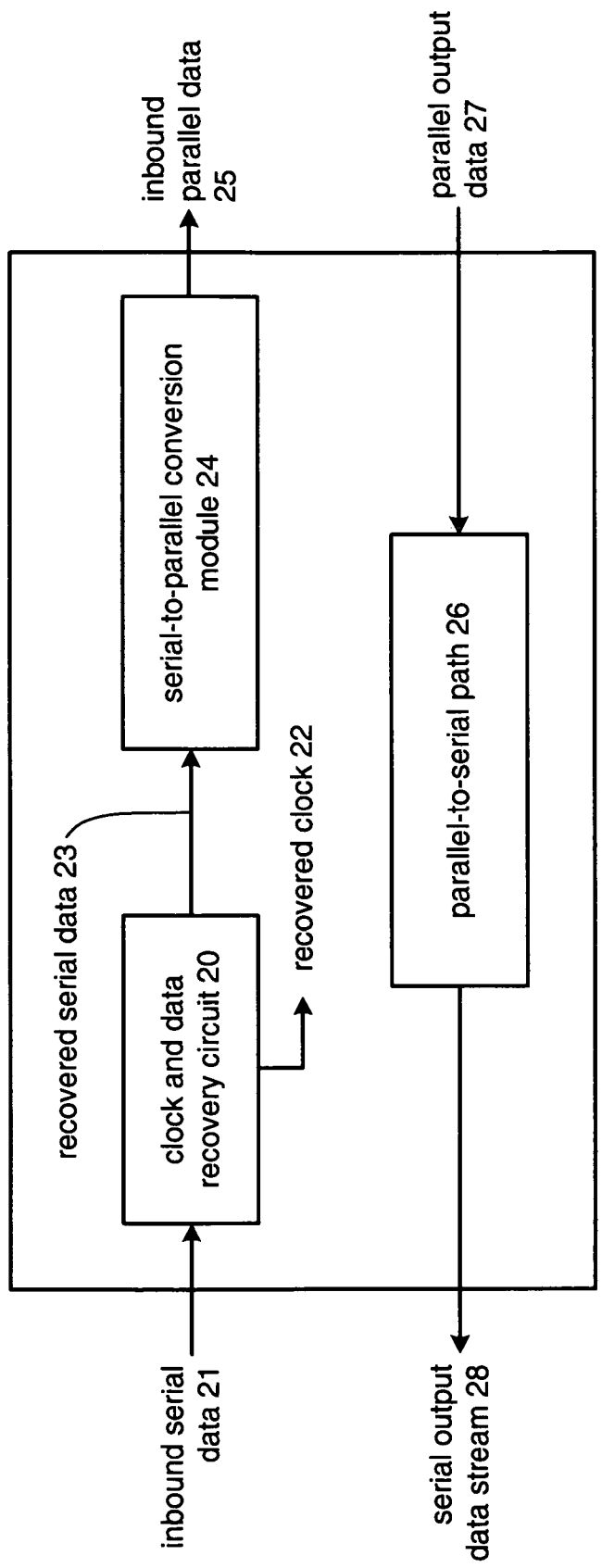
FIG. 2 is a schematic block diagram of a multi-gigabit transceiver (MGT) according to one embodiment of the present invention.

FIG. 2 is a schematic block diagram of a multi-gigabit transceiver (MGT) according to one embodiment of the present invention. The MGT includes a clock and data recovery circuit 20 that is coupled to receive inbound serial data 21 and that produces a recovered clock 22 and recovered serial data 23, a serial-to-parallel conversion module 24 that produces inbound parallel data 25 based upon the recovered serial data 23. The MGT of FIG. 2 further includes a parallel-to-serial path 26 that is coupled to receive parallel output data 27 and that produces serial output data stream 28 based upon the parallel output data 27.

In operation, the MGT receives parallel output data 27 from the programmable logic fabric (programmable logic fabric 12 of FIG. 1), memory (memory 16 of FIG. 1), or other sources, and converts it into serial output data stream 28. To facilitate the parallel-to-serial conversion, parallel-to-serial path 26, which may include an elastic store buffer, receives parallel-to-serial settings from the processing core to indicate the width of parallel output data 27 and the data rate of the parallel data. Based on the parallel-to-serial settings and at least one transmit clock, parallel-to-serial path 26 produces serial output data stream 28 from parallel output data 27.

The MGT also receives inbound serial data 21 from a source external to programmable logic device 10 and converts it into inbound parallel data 25. Clock and data recovery circuit 20, which will be described in greater detail with reference to FIGS. 3–7, receives inbound serial data 21 and latches the serial data at a rate substantially equal to one-half the serial data rate to produce a recovered serial data 23 and a recovered clock 22. Serial-to-parallel conversion module 24, which may include an elastic store buffer, receives recovered serial data 23 at a serial rate in accordance with recovered clock 22. Based on serial-to-parallel settings received from the processing core, serial-to-parallel conversion module 24 produces the inbound parallel data 25 to downstream components. The serial-to-parallel settings indicate the data rate and data width of the inbound parallel data 25.

Figure 3:
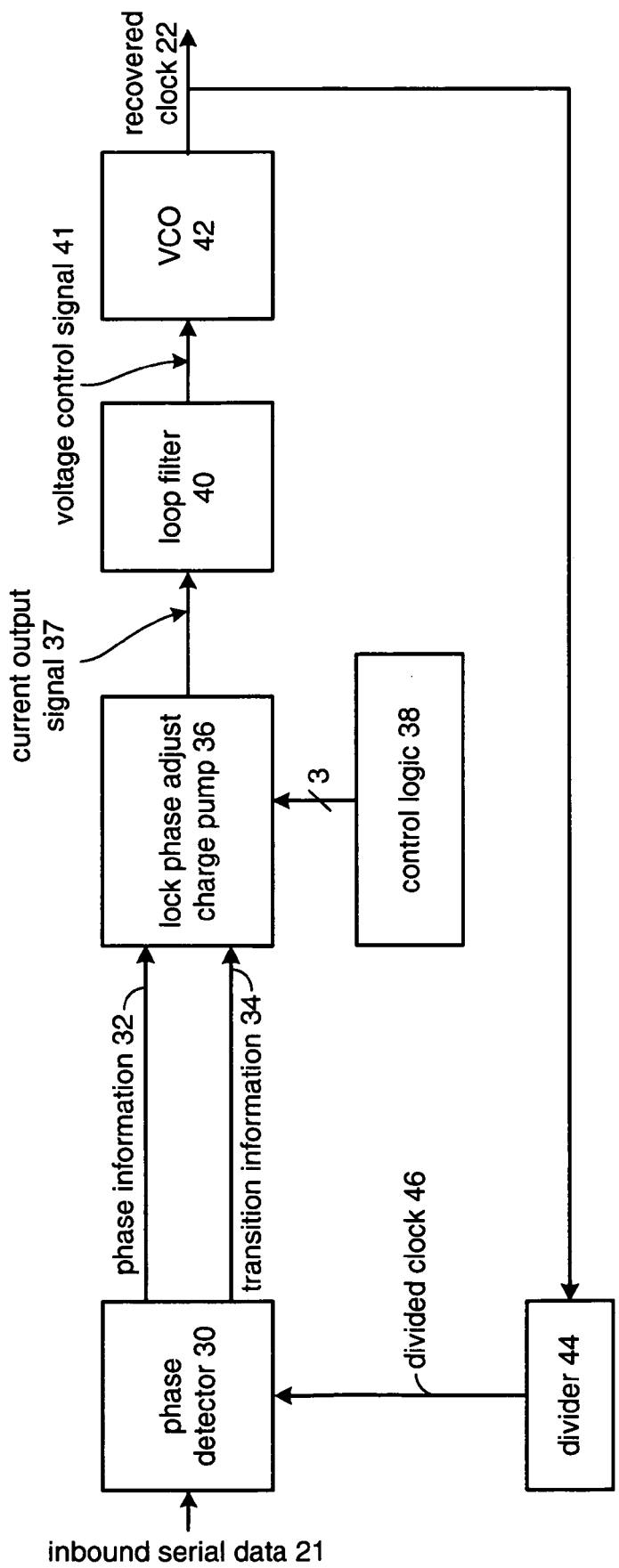
FIG. 3 is a schematic block diagram of a clock and data recovery circuit according to an embodiment of the present invention.

FIG. 3 is a schematic block diagram of clock and data recovery circuit 20 according to an embodiment of the present invention. Clock and data recovery circuit 20 comprises a phase detector 30, a lock phase adjust charge pump 36, control logic 38, a loop filter 40, a VCO 42, and a feedback path comprising a divider 44. Phase detector 30 is operably coupled to receive inbound serial data 21 and to produce therefrom phase information 32 and transition information 34, based on a divided clock 46. Lock phase adjust charge pump 36 receives phase information 32 and transition information 34 and produces a current output signal 37 to loop filter 40, that produces a voltage control signal 41 that is a function of the current output signal 37.

The magnitude of the voltage control signal 41, operably coupled to VCO 42, functions to adjust the oscillating frequency of VCO 42 so that the rising edge of divided clock 46 is substantially centered in the bit period of inbound serial data 21. The output of VCO 42, recovered clock 22, is operably coupled to divider 44 that divides recovered clock 22 by an integer, typically divided by one or two, to produce divided clock 46 to phase detector 30.

Figure 4:
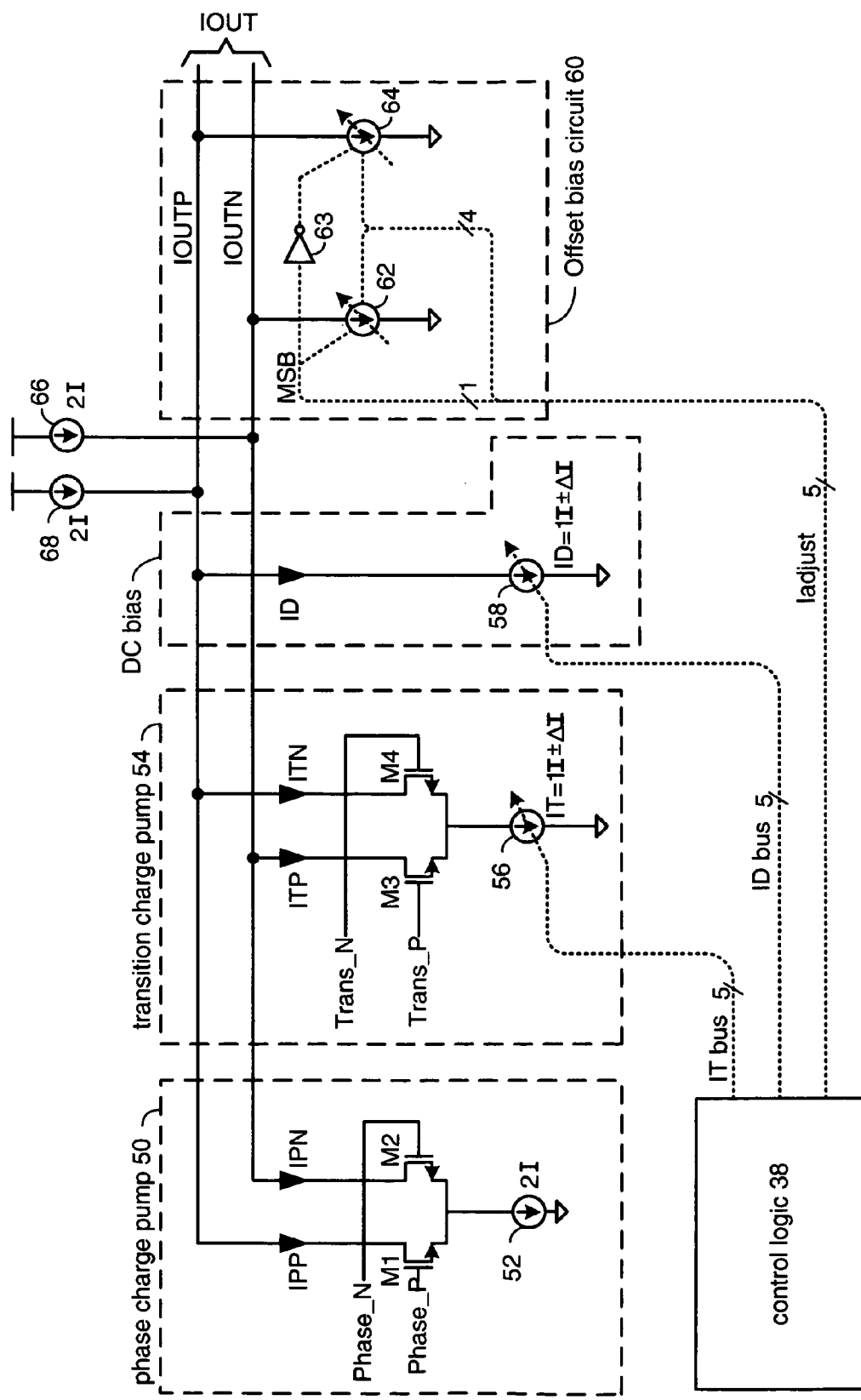
FIG. 4 is a schematic block diagram of a lock phase adjust charge pump according to an embodiment of the present invention.

FIG. 4 is a schematic block diagram of lock phase adjust charge pump 36 according to an embodiment of the present invention. Lock phase adjust charge pump 36 comprises phase charge pump 50, transition charge pump 54, programmable DC bias current sink 58, offset bias circuit 60, and current sources 66 and 68. Phase charge pump 50, transition charge pump 54, programmable DC bias current sink 58, and offset bias circuit 60 are coupled in parallel and are jointly operable to provide sample point alignment based upon a phase difference between the inbound serial data edge and a divided clock edge, upon a programmable bias value that is selectively added only during periods of data transition, and upon an offset current setting that nulls component process variation offset. Generally, to accomplish this, phase charge pump 50 is operable to produce a current proportional to the difference in the edge of the inbound serial data and the edge of the divided clock. Transition charge pump 54 and the DC bias current sink 58 are operable in a programmable and complementary fashion to cancel the current produced by phase charge pump 50 and the VCO drift during periods of no data transitions. Offset bias circuit 60 is operable to compensate for inherent component variations due to process, voltage, and temperature.

Phase charge pump 50 includes a differential pair comprising transistors M1 and M2 operably coupled to receive differential phase information 32 as signals Phase_P and Phase_N. Tail current source 52, having a magnitude of 2I, where I is a current unit, is operably coupled to the commonly coupled sources of transistors M1 and M2. The drains of transistors M1 and M2 are operably coupled to differential current output IOUTP and IOUTN, respectively.

Transition charge pump 54 includes differential transistor pair M3 and M4 operably coupled to receive differential transition information 34 as signals Trans_P and Trans_N. The commonly coupled sources of differential transistor pair M3 and M4 are operably coupled to programmable transition current sink 56. The drain of transistor M3 is coupled to differential output IOUTN while the drain of transistor M4 is coupled to differential output IOUTP.

A 5-bit digital bus, IT bus, is operably coupled to programmable transition current sink 56 from control logic 38. In operation, the IT bus is typically set to mid-range so that programmable transition current sink 56 produces a nominal current of one I.

A DC bias comprising programmable DC bias current sink 58 is operably coupled between differential output IOUTP and ground. Programmable DC bias current sink 58 is also controlled by a digital bus, ID bus, operably coupled to control logic 38. In normal operation, digital ID bus is set to mid-range so that programmable DC bias current sink 58 typically sinks a current equal to one I from IOUTP. Current sources 66 and 68 provide a fixed current of 2I to differential outputs IOUTN and IOUTP, respectively.

Offset bias circuit 60 includes current sink 62 and 64 operably coupled between IOUTN and IOUTP, respectively, and ground. Programmable offset bias current sink 62 and 64 controlled by 5-bit digital bus, Iadjust, operably coupled from control logic 38 and are typically set to zero in normal operation. Control logic 38 activates either bias current sink 62 or bias current sink 64 by way of the logic level of the most significant bit (MSB) of Iadjust. When the MSB is set to logic one, bias current sink 62 is activated and bias current sink 64 is deactivated by the logic zero coupled to bias current sink 64 by way of inverter 63. The remaining four bits of Iadjust select the magnitude of the current conducted by either bias current sink 62 or bias current sink 64. Offset bias circuit 60 functions to provide a programmable offset bias current to cancel any offset currents caused by component variation.

As was stated previously, it may be necessary to adjust the sampling point of inbound serial data 21. Some prior art designs adjust the sampling point by adding a constant offset bias to the charge pump current output. Such designs cause oscillation frequency instability, higher bit error rates, and eventually cause the VCO to loose lock during periods of consecutive equivalent logic data bits (not phase transitions). The embodiment of the present invention of FIG. 4 solves this problem by simultaneously incrementing and decrementing one of programmable transition current sink 56 and programmable DC bias current sink 58, to produce an offset current that cancels during periods of consecutive equivalent logic data bits (no phase transitions) and sums to provide the necessary offset bias during periods of non-consecutive equivalent logic data bits.

The embodiment of FIG. 4 produces the sampling offset by incrementing the programmable transition current sink 56 by a first delta value (a ΔI) while simultaneously decrementing programmable DC bias current sink 58 by a second delta value such that the offset current is substantially cancelled during periods of consecutive equivalent logic data bits. Alternatively, the programmable transition current sink 56 may be decremented by the first delta value while the programmable DC bias current sink 58 is incremented by the second delta value to produce a sampling offset in the opposite direction.

Stated differently, in a first state, the phase information is high during a portion of the bit period and the transition information is high indicating a transition in the phase information. In this state, there are enough transitions in phase information 32 so that phase detector 30 of FIG. 3 can accurately recover one of clock and data from inbound serial data 21. As long as there is at least one phase transition per bit period of inbound serial data 21, transition information 34 will remain high and the leading edge of recovered clock 23 will maintain its position relative to the center of the bit period of inbound serial data 21 unless adjusted away from the center of the bit period as previously discussed. In a second state, phase information 32 is low for a portion of the bit period and transition information 34 is high indicating a change in the phase information. The second state will always follow the first state within one bit period. The average current produced as IOUT to loop filter 40 averages to zero over this one full bit period and the phase detector remains locked to the inbound serial data 21 because the current produced by the transition charge pump is canceled out by the current produced by the DC current source.

In a third state, however, phase information 32 contains consecutive equivalent logic data bits, i.e., no phase transitions, so phase detector 30 sets transition information 34 low to stop lock phase adjust charge pump 36 from updating the control voltage produced to VCO 42 thereby preventing erroneous changes in the frequency of VCO 42. In this third state, transition charge pump 54 driven by the transition information, signals Trans_P and Trans_N, and the DC bias current 58 substantially cancel the current produced by the phase charge pump 50 during periods of no phase transitions.

Figure 5:
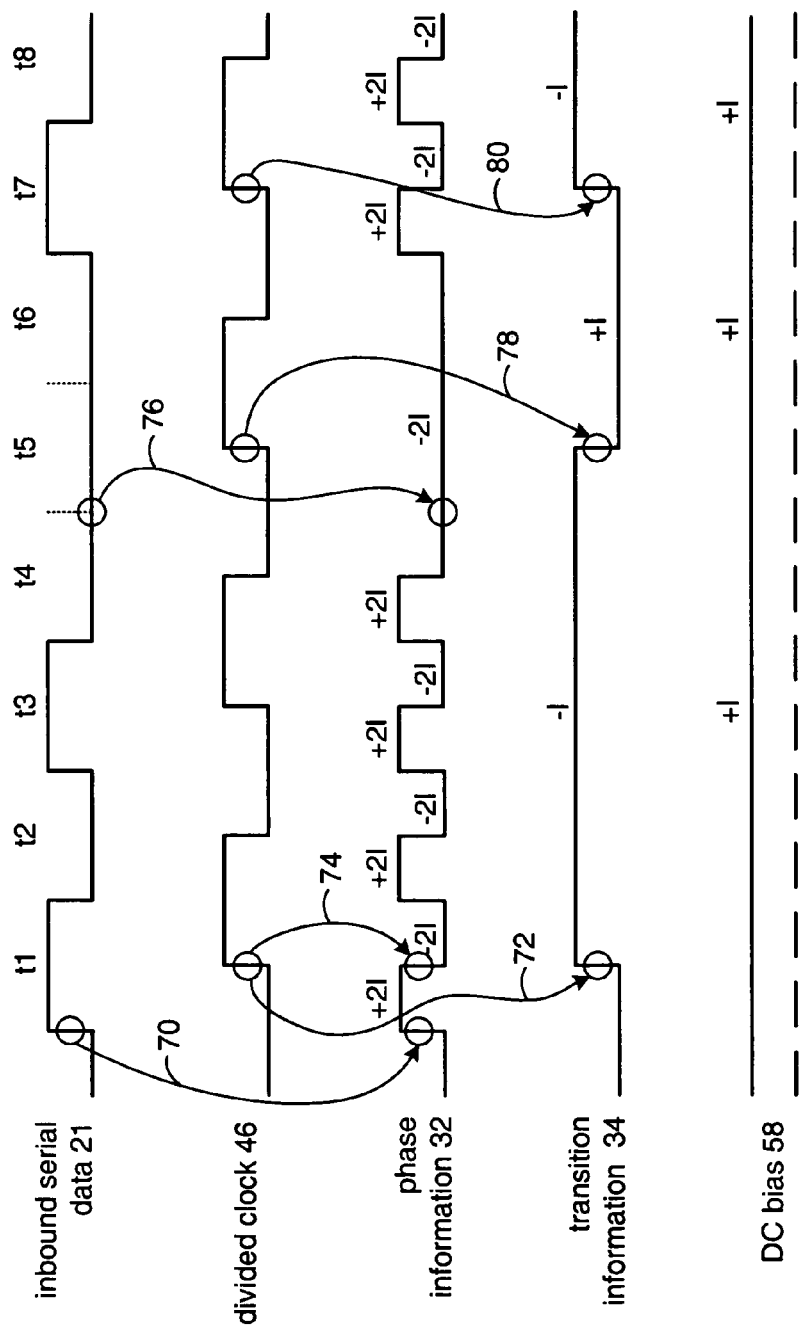
FIG. 5 is a graph illustrating lock phase charge pump timing diagram in accordance with an embodiment of the present invention.

FIG. 5 is a graph illustrating a lock phase charge pump timing diagram in accordance with an embodiment of the present invention. Inbound serial data 21 contains a series of non-consecutive equivalent logic data bits and consecutive equivalent logic data bits over a period arbitrarily defined as t1 through t8. Divided clock 46 represents the clock recovered by the phase locked clock and data recovery circuit 20 of FIG. 3. As can be seen in FIG. 5, the rising edge of inbound serial data 21 at time t1 leads to a rising edge in phase information 32 as indicated by sequence line 70. One-half bit period later, on the rising edge of divided clock 46, the phase detector produces a rising edge in transition information 34 as indicated by sequence line 72. When the phase is locked to inbound serial data 21, the rising edge of divided clock 46 will be maintained in the center of the bit period. The rising edge of divided clock 46 produces a falling edge in phase information 32 as indicated by sequence line 74. The rising and falling edges of phase information 32 indicates the presence of non-consecutive equivalent logic data bits in inbound serial data 21 that is latched by phase detector 30. Phase detector 30 produces phase signal 32 and transition signal 34 based on the latched data. Transition information 34 is held high by the latched data as long as there is a transition in the latched data as is also indicated by a transition in phase signal 32. The high level of transition information 34 functions to keep the lock phase adjust charge pump active.

As soon as inbound serial data 21 contains a series of consecutive equivalent logic data bits, transition information 34 will go low. This is indicated by sequence lines 76 indicating inbound serial data 21 contains consecutive logic zero data bits at time t4 and t5. On the next rising edge of divided clock 46, transition information 34 will go low as indicated by sequence line 78. As may be seen in FIG. 5, the arrival of a consecutive non-equivalent logic data bit at time t7 causes a rising edge in phase information 32 and a corresponding rising edge in transition information 34 one-half bit period later. This is indicated by sequence line 80.

In the described embodiment of the present invention, the transition charge pump driven by transition information 34 and the DC bias current 58 cancel out to prevent changes in the VCO frequency during periods of consecutive non-equivalent logic data bits. As may be further seen in time period t1 through t4, phase information 32 causes a current of +2I to flow during one-half bit period and a current of −2I to flow during the other half of the bit period. The average current supplied to the loop filter is substantially zero. Additionally, during the time period t1 through t4, the current conducted by the transition charge pump, −I, and the current conducted by the programmable DC bias current sink, +I, also cancel so the current coupled to the loop filter is substantially zero. Under these conditions the control voltage coupled to the VCO is held constant and the loop remains locked to inbound serial data 21.

During periods of consecutive equivalent logic data bits, the constant DC bias current and the transition charge pump current add up in order to cancel out the phase charge pump current to prevent the VCO frequency from changing erroneously. As indicated during time periods t5 and t6, the phase charge pump conducts −2I while the transition charge pump conducts +I that, when summed with the +I constant DC bias, substantially cancels the current coupled to the loop filter.

One aspect of an embodiment of the present invention is the shifting of the inbound serial data 21 sampling point by adjusting the relative position of the rising edge of divided clock 46 with respect to the rising edge of inbound serial data 21. The apparatus and methods of the described embodiments of the present invention maintain phase lock during periods of consecutive non-equivalent logic data bits by adjusting the magnitude of the currents conducted by the programmable transition current sink and the programmable DC bias current sink in equal but opposite steps. For example, if the sampling point is to be shifted later in time in FIG. 5, the width of the high portion of phase information 32 is greater (more time) than the width of the low portion of phase information 32 (less time). The average of the currents over several bit periods would be greater than zero in this case.

By incrementing the current conducted by programmable transition current sink 56 and by decrementing the current conducted by programmable DC bias current 58 (or visa versa), the unequal currents substantially match the current differences in phase information 32. Thus under conditions of consecutive non-equivalent logic data bits and an offset sampling point, the embodiment of the present invention functions to maintain a stable clock and data recovery circuit.

The same will also be true under the conditions of consecutive equivalent logic data bits as the current of the programmable transition current and the programmable DC current will cancel out the negative phase current during the bit period.

During periods of consecutive equivalent logic data bits, phase information 32 is low due to the lack of transitions in inbound serial data 21 causing phase charge pump 50 to produce a current of −2I. Transition information 34 will go low on the next rising edge of divided clock 46 causing transition charge pump 54 to produce a current of +I that sums with the +I produced by DC bias 58 to substantially cancel the phase charge pump current. When the programmable transition current sink 56 is incremented/decremented and the programmable DC bias current 58 is decremented/incremented, the currents add up to a fixed value in which a current of +2I will cancel the −2I current from the phase charge pump. Thus, during periods of consecutive equivalent logic data bits, the current produced by lock phase adjust charge pump 36 is substantially zero thereby preventing the VCO from erroneously changing frequency.

Figure 6A:
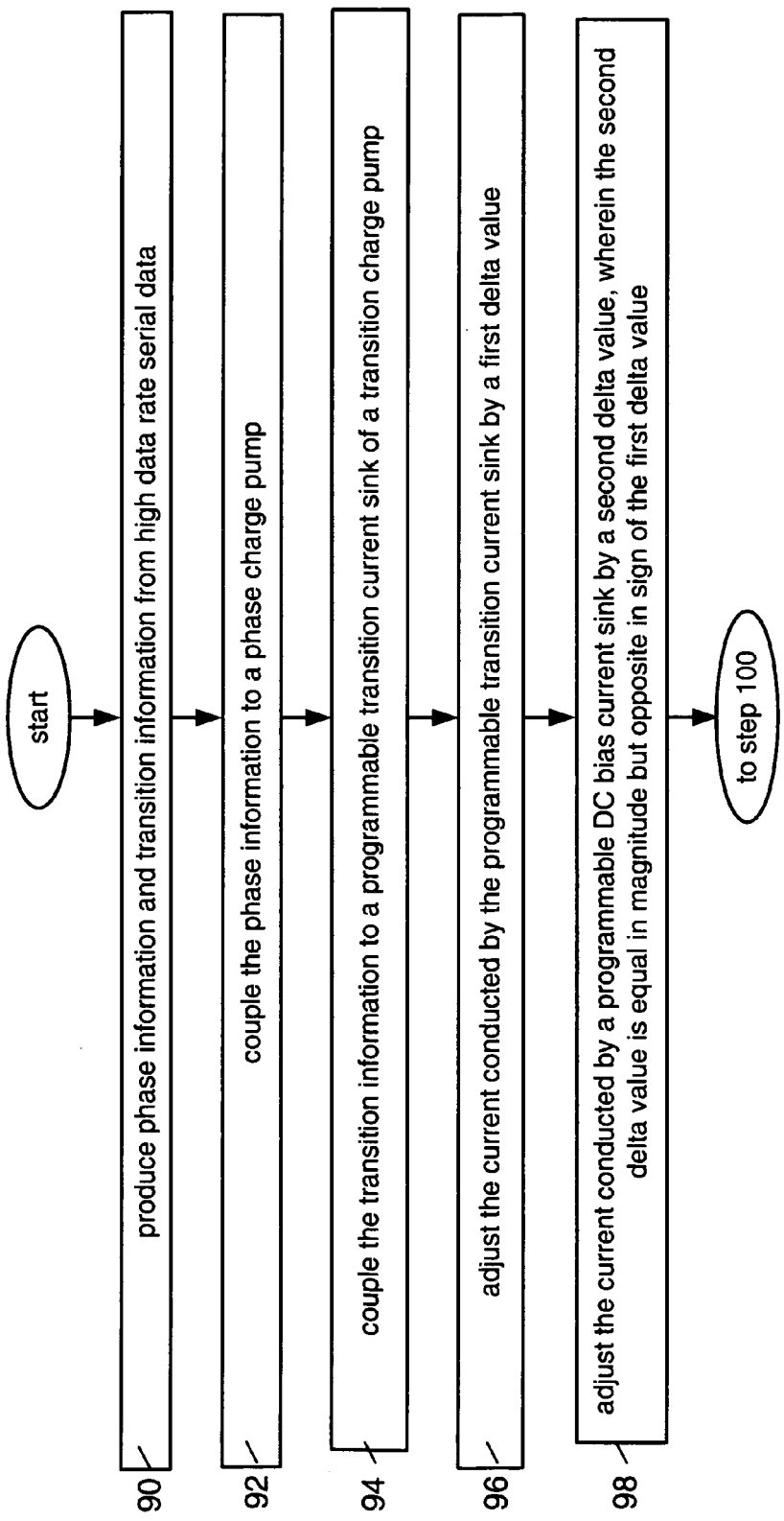
FIGS. 6a and 6b are flow charts of a method according to an embodiment of the present invention.
Figure 6B:
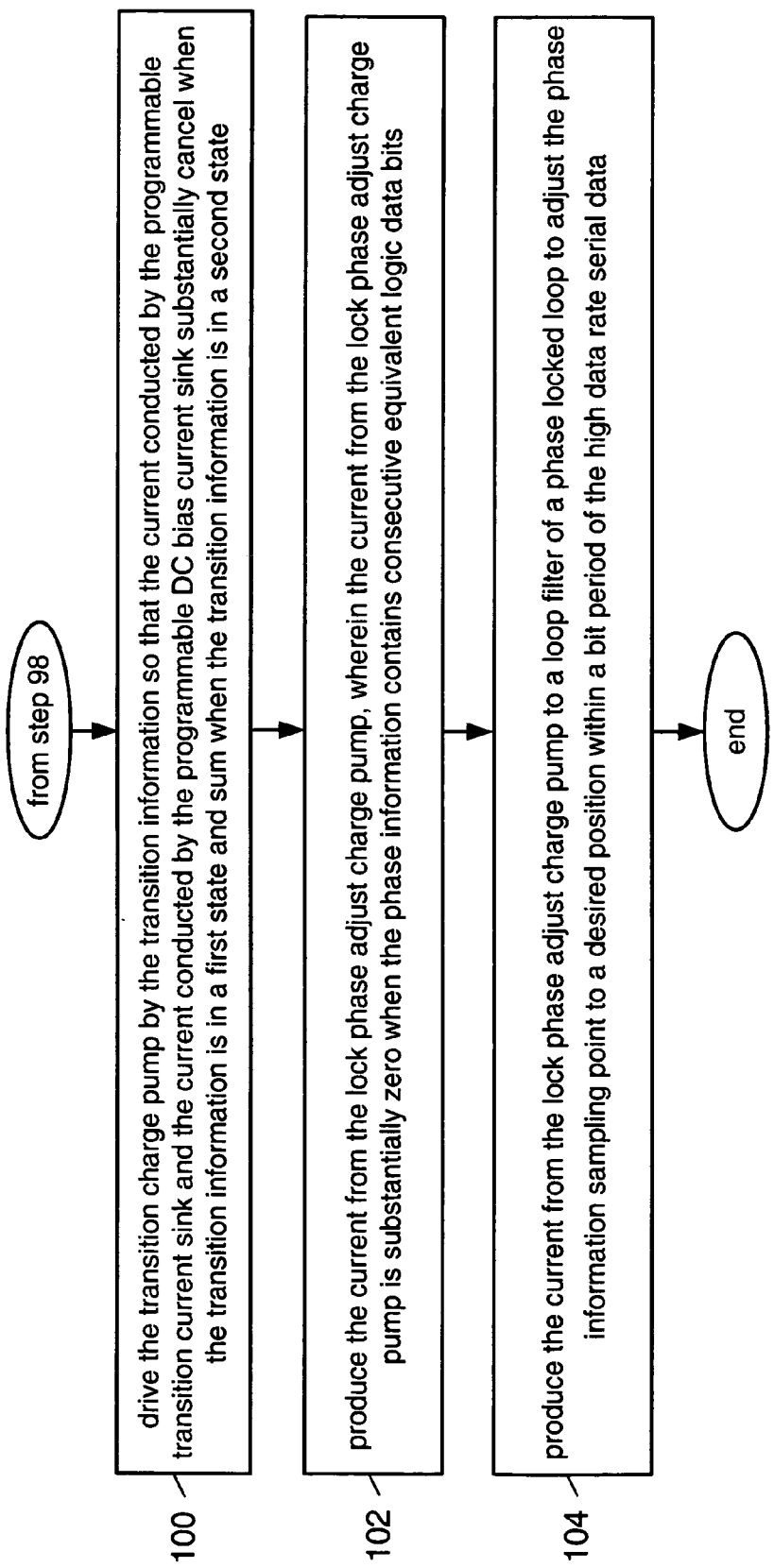

FIGS. 6a and 6b are flow charts of a method according to an embodiment of the present invention. The method in a lock phase adjust charge pump for data-density independent sampling point adjustment produces phase information and transition information from high data rate serial data (step 90), as is known to one of average skill in the art. The phase information is then coupled to a phase charge pump (step 92) while the transition information is coupled to a transition charge pump, the transition charge pump further includes a programmable transition current sink (step 94).

In order to introduce a phase offset that is independent of data density, the current conducted by the programmable transition current sink is adjusted by a first delta value (step 96) and the current conducted by a programmable DC bias current sink is adjusted by a second delta value, wherein the second delta value is equal in magnitude but opposite in sign of the first delta value (step 98). The first and second delta values are controlled by a digital bus that is a five-bit bus in one embodiment of the invention. External control logic typically sets the programmable transition current sink and the programmable DC bias current sink to mid range.

The embodiment of the present invention maintains data-density independence by changing the current conducted by the programmable current sinks so that one conducts a fixed current plus a delta value while the other conducts a fixed current minus the delta value. The method drives the transition charge pump by the transition information so that the current conducted by the programmable transition current sink and the current conducted by the programmable DC bias current sink substantially cancel when the transition information is in a first state and sum when the transition information is in a second state (step 100).

Thereafter, the method of the described embodiment includes producing current from the lock phase adjust charge pump to a loop filter of a phase locked loop, wherein the current from the lock phase adjust charge pump is substantially zero when the phase information contains consecutive equivalent logic data bits (step 102). During periods of consecutive equivalent logic data bits, i.e., no transitions in the phase information, any updating of the control voltage to the VCO will introduce error.

It is sometimes necessary to move the sampling point to a position other than in the center of a bit period. Thus the embodiment of the inventive method includes producing current from at least two programmable current sinks operably coupled to move a phase information sampling point to a desired position within the high data rate serial data bit period (step 104). The embodiment of the present invention adjusts the current by an external control logic that adjusts a digital bus operably coupled to the programmable transition current sink, the programmable DC bias current sink, and the at least two programmable DC offset current sinks. In order to achieve data-density independence, the external control logic changes the current conducted by the transition charge pump and the current conducted by the DC bias current sink in a complementary fashion. For example, if the external control logic increments the transition charge pump current by a small value from the nominal setting then the DC bias current will be decremented by the small value. Stated differently, the small current steps are of equal magnitude but opposite in sign.

Figure 7A:
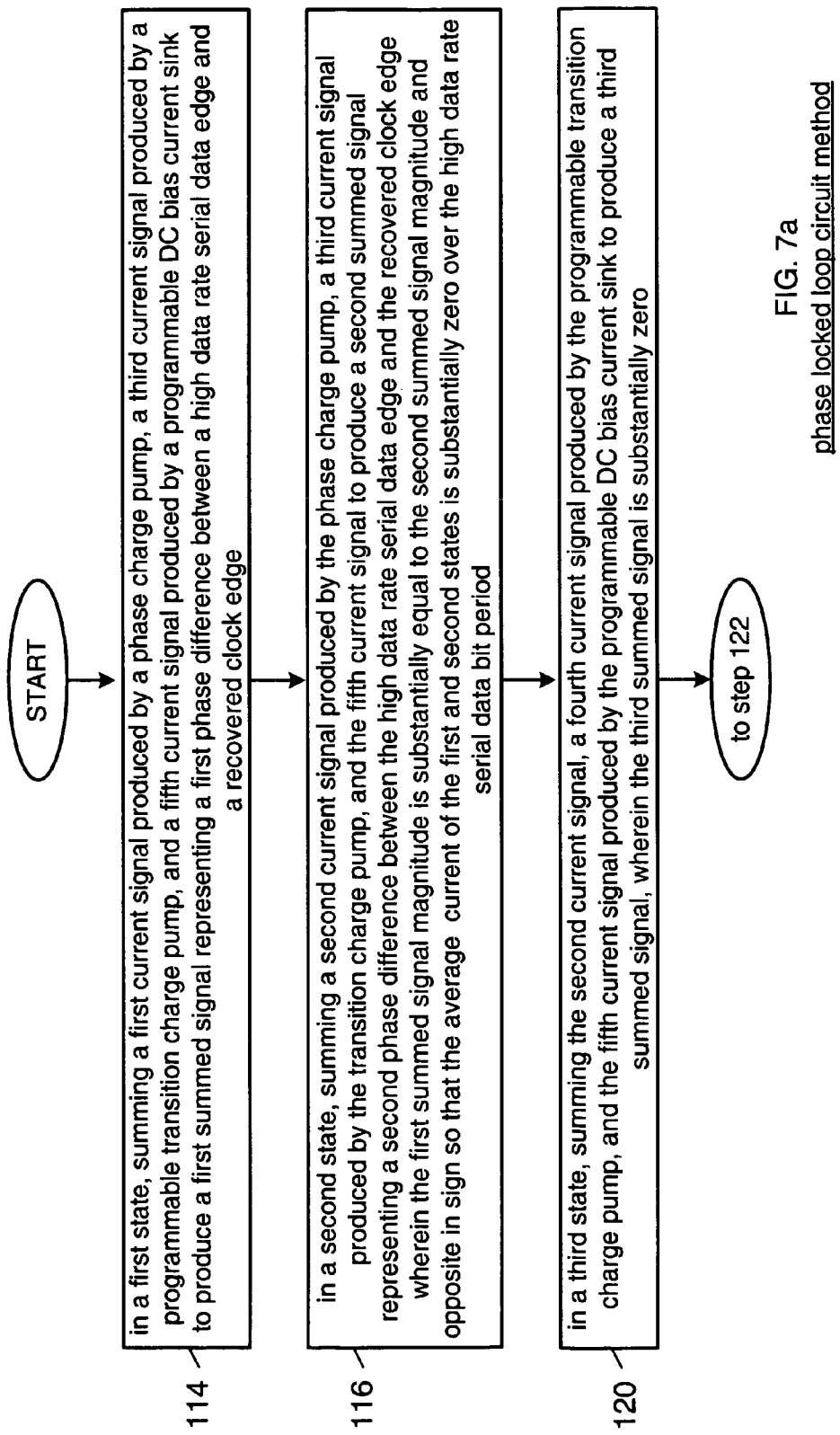
FIGS. 7a and 7b are flow charts of a method according to an embodiment of the present invention.
Figure 7B:
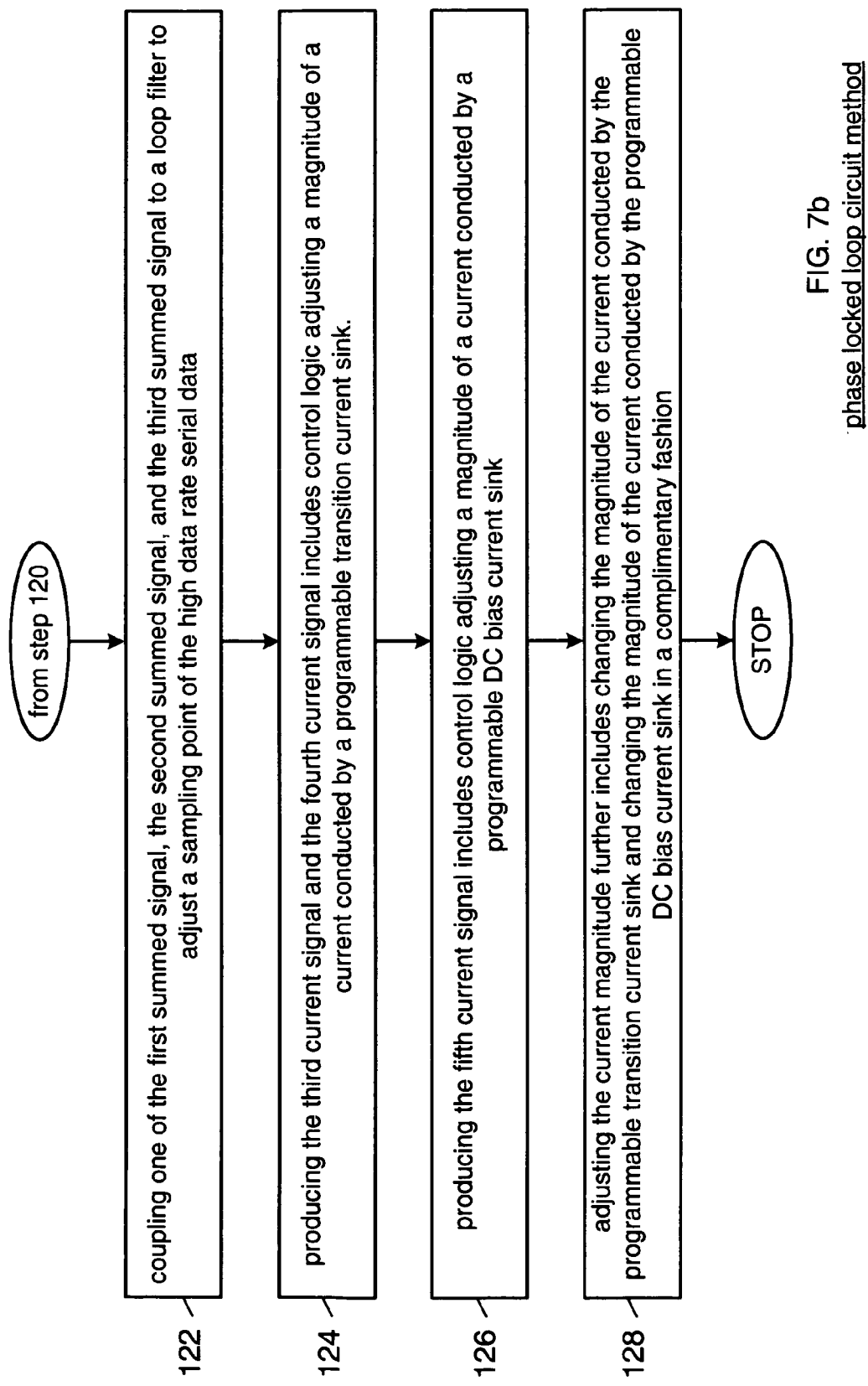

FIGS. 7a and 7b are flow charts of a method according to an embodiment of the present invention. A embodiment of the method in a data density independent clock and data recovery system includes, in a first state, summing a first current signal produced by a phase charge pump, a third current signal produced by a transition charge pump, and a fifth current signal produced by a programmable DC bias current sink to produce a first summed signal representing a first phase difference between a high data rate serial data edge and a recovered clock edge (step 114).

Thereafter, in a second state, the method according to the described embodiment, includes summing a second current signal produced by the phase charge pump, a third current signal produced by the transition charge pump, and the fifth current signal to produce a second summed signal representing a second phase difference between the high data rate serial data edge and a recovered clock edge (step 116), wherein the first summed signal magnitude is substantially equal to the second summed signal magnitude and opposite in sign so that the average current of the first and second states is substantially zero over the high data rate serial data bit period. The method includes, in a third state, summing the second current signal, a fourth current signal produced by the transition charge pump, and the fifth current signal to produce a third summed signal, wherein the third summed signal is substantially zero (step 120).

Thereafter, method according to the described embodiment includes coupling one of the first summed signal, the second summed signal, and the third summed signal to a loop filter to adjust a sampling point of the high data rate serial data (step 122). Thereafter, the method according to the described embodiment includes producing the third current signal and the fourth current signal that includes control logic adjusting a magnitude of a current conducted by a programmable transition current sink (step 124) and then producing the fifth current signal that includes control logic adjusting a magnitude of a current conducted by a programmable DC bias current sink (step 126).

Finally, the method according to the described embodiment includes changing the magnitude of the current conducted by the programmable transition current sink while changing the magnitude of the current conducted by the programmable DC bias current sink in a complimentary fashion (step 128). The magnitudes may be one of equal increments and non-equal increments.

Figure 8:
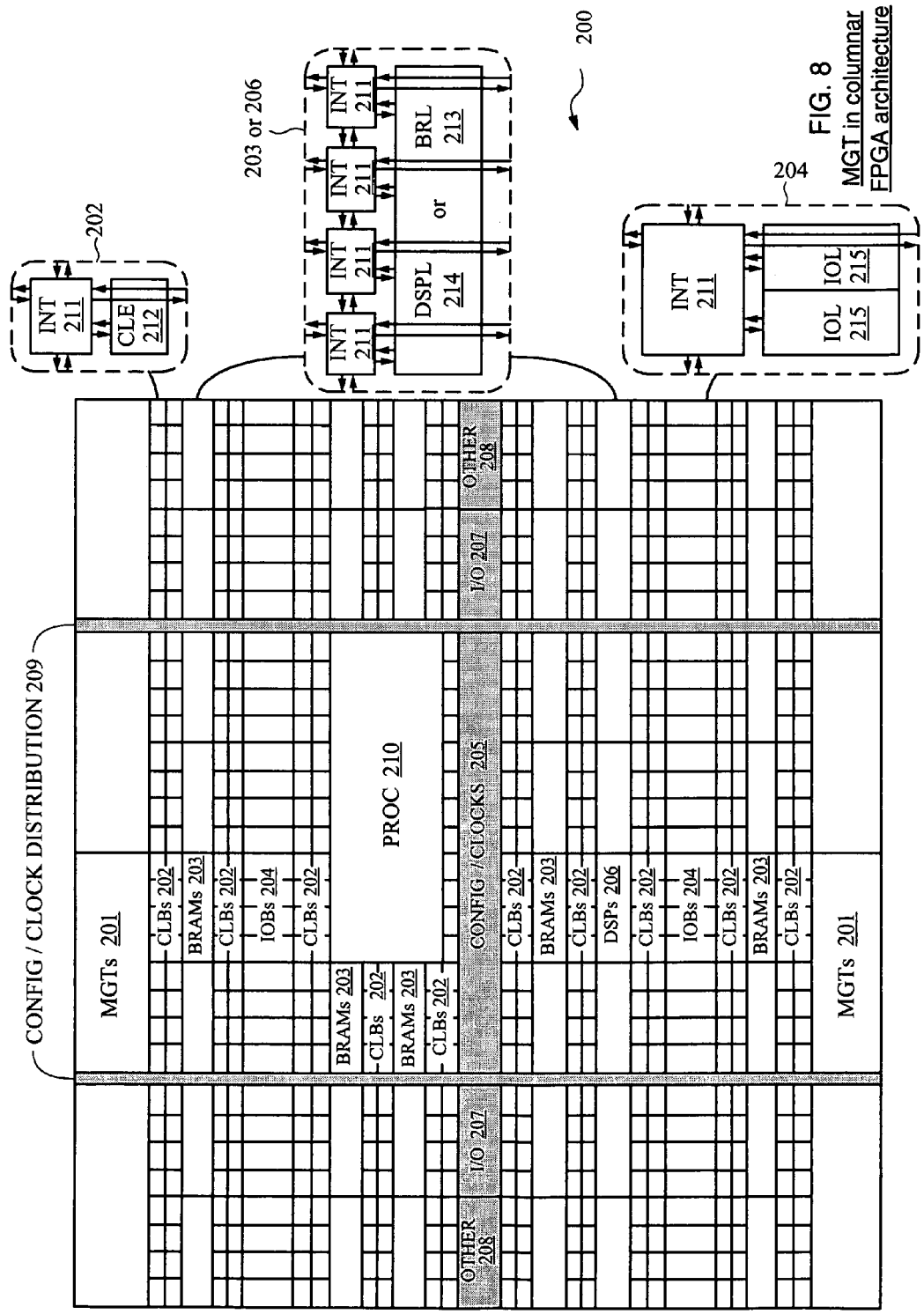
FIG. 8 illustrates an FPGA architecture that may be used for the various embodiments of the present invention.

The above description of the embodiments of the present invention may be implemented utilizing different circuit technologies including various different FPGA technologies and topologies. For example, FPGA devices may employ an I/O ring architecture or a columnar architecture. Advanced FPGAs can include several different types of programmable logic blocks in the array. For example, FIG. 8 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 8.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment of FIG. 8, a columnar area near the center of the die (shown shaded in FIG. 8) is used for configuration, clock, and other control logic. Horizontal areas 209 extending from this column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 210 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic. Thus, the FPGA of FIG. 8 illustrates but one architecture within which the various embodiments of the invention may be presented.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents, and alternatives falling within the spirit and scope of the present invention as defined by the claims.

What is claimed is:

1. A clock and data recovery system comprises:
   a phase detector operably coupled to receive high data rate serial data and to recover even and odd data from the high data rate serial data based on a divided clock and to produce phase information and transition information based on the recovered even and odd data;
   a lock phase adjust charge pump operably coupled to receive the phase information and transition information and to produce a current signal responsive to the phase information and transition information, wherein the lock phase adjust charge pump includes:
      a phase charge pump driven by the phase information;
      a transition charge pump driven by the transition information, the transition charge pump further including a programmable transition current sink;
      a programmable DC bias current sink; and
      at least two programmable offset bias current sinks;
   a loop filter for converting the current signal to a control voltage signal;
   a voltage controlled oscillator for producing a clock signal to the phase detector based on the control voltage signal;
   a divider operably coupled to receive the clock signal and to produce the divided clock to the phase detector; and
   control logic operable coupled to adjust the programmable transition current sink, the programmable DC bias current sink, and the at least two programmable offset bias current sinks over a plurality of n-bit buses.

2. The clock and data recovery system of claim 1 wherein the lock phase adjust charge pump produces no net current to the loop filter when the phase information contains consecutive equivalent logic data bits and the recovered clock is in the center of the data bit.

3. The clock and data recovery system of claim 2 wherein the programmable transition current sink and the DC bias current sink selectively adjust the phase detector sampling point away from a center of a bit period.

4. The clock and data recovery system of claim 3 wherein the control logic adjusts the programmable transition current sink by a first delta value and the programmable DC bias current sink by a second delta value.

5. The clock and data recovery system of claim 4 wherein the control logic adjusts the programmable transition current sink and the programmable DC bias current sink so that both are either incremented by the first delta value or decremented by the second delta value, respectively.

6. The clock and data recovery system of claim 4 wherein the control logic adjusts the programmable transition current sink by the first delta value and adjusts the programmable DC bias current sink by the second delta value, wherein the sign of the first delta value is opposite the sign of the second delta value so that one value increments as the other value decrements.

7. The clock and data recovery system of claim 6 wherein the transition charge pump, driven by the transition information, and the DC bias current substantially cancel an offset current during periods of consecutive equivalent logic data bits.

8. A lock phase adjust charge pump for producing a current signal responsive to phase information and transition information, comprising:
   a phase charge pump operably coupled to receive phase information wherein the phase charge pump produces a phase charge pump current;
   a transition charge pump operably coupled to receive transition information, the transition charge pump further including a programmable transition current sink wherein the transition current pump produces a transition current; and
   a programmable DC bias current sink wherein the programmable DC bias current sink produces a DC bias current that cancels transition current upon a data transition and sums with the transition current to collectively cancel the phase charge pump current for periods in which there is no data transition.

9. The lock phase adjust charge pump of claim 8 further including at least two programmable offset bias current sinks wherein the programmable DC bias current sink and the at least two programmable offset bias current sinks are operably coupled to sink current produced by the phase charge pump.

10. The lock phase adjust charge pump of claim 9 wherein the lock phase adjust charge pump produces no net current to the loop filter when the phase information contains consecutive equivalent logic data bits and the recovered clock is in the center of the data bit.

11. The lock phase adjust charge pump of claim 10 wherein the programmable transition current sink and the DC bias current sink selectively adjust the phase detector sampling point away from a center of a bit period.

12. The lock phase adjust charge pump of claim 11 wherein control logic adjusts the programmable transition current sink by a first delta value and the programmable DC bias current sink by a second delta value.

13. The lock phase adjust charge pump of claim 12 wherein the control logic adjusts the programmable transition current sink and the programmable DC bias current sink so that both are either incremented by the first delta value or decremented by the second delta value, respectively.

14. The lock phase adjust charge pump of claim 13 wherein the transition charge pump, driven by the transition information, and the DC bias current substantially cancel an offset current during periods of consecutive equivalent logic data bits.

15. The lock phase adjust charge pump of claim 14 wherein the at least two programmable offset bias current sinks are each selectively adjusted to substantially compensate for inherent circuit offset currents.

16. A method to adjust a sampling point of a data-density independent lock phase adjust charge pump, the method comprising:

producing phase information and transition information from high data rate serial data;

coupling the phase information to a phase charge pump;

coupling the transition information to a transition charge pump, the transition charge pump further including a programmable transition current sink;

adjusting the current conducted by the programmable transition current sink by a first delta value;

adjusting the current conducted by a programmable DC bias current sink by a second delta value, wherein the second delta value is equal in magnitude but opposite in sign of the first delta value;

driving the transition charge pump by the transition information so that the current conducted by the programmable transition current sink and the current conducted by the programmable DC bias current sink substantially cancel when the transition information is in a first state and sum when the transition information is in a second state; and producing the current from the lock phase adjust charge pump to a loop filter of a phase locked loop to adjust the phase information sampling point to a desired position within a bit period of the high data rate serial data.

17. The method of claim 16 wherein the step of producing the current from the lock phase adjust charge pump produces a current that is substantially zero when the phase information contains consecutive equivalent logic data bits.

18. The method of claim 15 wherein the step of producing the current from the lock phase adjust charge pump further includes selectively producing current from one of at least two programmable DC offset current sinks to substantially cancel an inherent circuit offset.

19. The method of claim 18 wherein the step of adjusting the current further includes control logic adjusting a digital bus operably coupled to the programmable transition current sink, the programmable DC bias current sink, and the at least two programmable DC offset current sinks.

20. The method of claim 19 wherein the at least two programmable DC offset current sinks have greater resolution than either the programmable transition current sink or the programmable DC bias current sink.

* * * * *